United States Patent
Shin et al.

(10) Patent No.: US 6,762,268 B2
(45) Date of Patent: Jul. 13, 2004

(54) ACETAL GROUP CONTAINING NORBORNENE COPOLYMER FOR PHOTORESIST, METHOD FOR PRODUCING THE SAME AND PHOTORESIST COMPOSITION CONTAINING THE SAME

(75) Inventors: Jung Han Shin, Daejun-Shi (KR); Bong Seok Moon, Daejun-Shi (KR); Ouck Han, Daejun-Shi (KR); Keun Byoung Yoon, Daejun-Shi (KR); Eun Sil Han, Daejun-Shi (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 16 days.

(21) Appl. No.: 10/126,985

(22) Filed: Apr. 22, 2002

(65) Prior Publication Data

US 2003/0004289 A1 Jan. 2, 2003

(30) Foreign Application Priority Data

Apr. 21, 2001 (KR) .................................... 2001-0021602
Dec. 26, 2001 (KR) .................................... 2001-0085022

(51) Int. Cl.$^7$ ............................................ C08F 120/04
(52) U.S. Cl. .................... 526/318.3; 526/171; 526/280; 526/282; 526/316; 526/317.1; 526/318; 526/320
(58) Field of Search ................................ 526/171, 280, 526/282

(56) References Cited

U.S. PATENT DOCUMENTS

| | | | | |
|---|---|---|---|---|
| 6,159,655 A | * | 12/2000 | Sato | 430/270.1 |
| 6,160,068 A | * | 12/2000 | Sumino | 526/281 |
| 6,369,181 B1 | * | 4/2002 | Jung et al. | 526/281 |
| 6,426,171 B1 | * | 7/2002 | Jung et al. | 430/270.1 |
| 6,465,147 B1 | * | 10/2002 | Lee et al. | 430/270.1 |

FOREIGN PATENT DOCUMENTS

EP    1 127 900 A1  *  2/2000

OTHER PUBLICATIONS

Okoroanyanwu et al. Chemistry of Materials (1998), 10(11), 3319–3327.*
Okoroanyanwu et al. Chemistry of Materials (1998), 10(11), 3328–3333.*
Okoroanyanwu et al. Journal of Molecular Catalysis A: Chemical 133 (1998), 93–114.*

* cited by examiner

Primary Examiner—Helen L. Pezzuto
(74) Attorney, Agent, or Firm—Lee & Sterba, P.C.

(57) ABSTRACT

An acetal group containing norbornene-based copolymer useful for a photoresist composition, a method for producing the same, and a photoresist composition containing the same are disclosed. According to the present invention, a copolymer of the present invention has excellent transparency at a wavelength of not more than about 250 nm, excellent resolution, excellent sensitivity, dry etching resistance and excellent adhesion to the substrate.

6 Claims, 1 Drawing Sheet

ACETAL GROUP CONTAINING NORBORNENE COPOLYMER FOR PHOTORESIST, METHOD FOR PRODUCING THE SAME AND PHOTORESIST COMPOSITION CONTAINING THE SAME

BACKGROUND OF THE INVENTION

1. Field of the Invention

The present invention relates to an acetal group containing norbornene copolymer for use in a photoresist composition, a method for producing the same, and a photoresist composition containing the same. More particularly, the present invention relates to an acetal group containing norbornene copolymer that has improved properties and that includes norbornene or norbornene derivatives as its main chain. The invention also relates to an easy method for producing the copolymer.

2. Description of the Related Art

Lithography today has become a core technology in accomplishing large scale integrity of a memory semiconductor, DRAM. Specifically, improved lithography technology capable of forming finer patterns now is required in manufacturing VLSI (very large scale integrated circuit). In order to meet this requirement, it has become increasingly important to provide resist materials having high efficiency.

In general, photoresist compositions typically should exhibit transparency at an exposure wavelength, have excellent etching resistance, heat resistance and adhesion strength. In addition, photoresist compositions that are used in a lithography process with an excimer laser should be developable in a 2.38 weight % aqueous solution of tetramethyl ammonium hydroxide (TMAH). It is very difficult, however, to synthesize a photoresist resin that satisfies all of these requirements. For example, acrylic polymers have attracted attention for their ease of synthesis and low light-absorptivity at a light wavelength of 200 or less nm, but they have poor dry etching resistance.

In order to improve the etch resistance of these acrylic polymers, alicyclic unit's have been introduced into the main chain or the side chain of acryl-based copolymers. Examples of alicyclic units introduced into the main chain of an acryl-based copolymer include norbornene, norbornene derivatives, cyclodiene and nortricyclene, and the like. Examples of alicyclic units introduced to the side chain of an acryl-based copolymer include isobornyl, menthyl, tricyclodecanyl, norbornyl, tetracyclododecyl, adamantyl and the like. Copolymers having alicyclic units introduced into its side chain usually have an acrylic polymer as its main chain, and the content of its alicyclic units typically is less than 50 weight % of the total copolymer. As a result, copolymers having alicyclic units in its side chain exhibit poor solubility in an alkaline aqueous solution, and exhibit poor adhesive strength to a substrate because alicyclic units introduced increase Tg (glass transition temperature) and hydrophobicity of the polymer. These copolymers also often suffer from problems due to fragility and poor sensitivity. On the other hand, copolymers having alicyclic units introduced into its main chain exhibit excellent dry-etching resistance and thermal properties and is advantageous because side chains having functionalities required for patterning can be introduced. Thus, many research has been conducted to obtain a matrix resin, of which the main chain is composed of an alicyclic structure.

In general, polymerization methods such as radical polymerization, cationic polymerization, addition polymerization, or ring-opening polymerization have been used to obtain the conventional multicyclic polymers such as norbornene polymers and norbornene derivative polymers. However, these methods are problematic in that the polymerization yield typically is low and their uses are restricted to monomers having polarity. Due to the complicated structures of most catalysts used for polarization, these methods may be affected by moisture during polymerization, and thus, only dry hydrocarbon solvents or dry halogenated aromatic solvents can be used.

The description herein of certain disadvantages associated with known photoresist compositions and polymers used therein is not intended to limit the present invention. Indeed, the present invention may include some or all of the polymers and photoresist compositions described above, without suffering from the same disadvantages.

SUMMARY OF THE INVENTION

In an effort to solve these problems, It is a feature of the present invention to provide norbornene-based copolymers that have excellent transparency, resolution, sensitivity and etching resistance and that are useful in lithography processes for making very large scale integrated semiconductor with an excimer laser. It is another feature of the present invention to provide a simple and easy preparation method of the photoresist norbornene-based copolymers of this invention. It is still another feature of the present invention to provide a photoresist composition useful in lithography processes for making very large scale integrated semiconductor with an excimer laser.

According to an aspect of the present invention, there is provided a novel acetal group containing norbornene copolymer useful in a photoresist composition, the copolymer being represented by the following Formula 1.

Formula 1

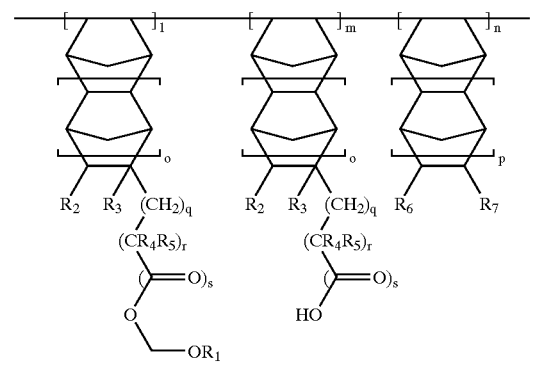

wherein $R_1$ is $C_{1-12}$ linear, branched or cyclic alkyl group; $R_2$, $R_3$, $R_4$ and $R_5$ are independently hydrogen, fluorine, methyl or trifluoromethyl;

$R_6$ and $R_7$ are independently hydrogen or $C_{1-10}$ linear or branched alkyl group, $-(CH_2)_t-R_8$, $-(CH_2)_t-OR_8$, $-(CH_2)_t-C(O)OR_8$, $-(CH_2)_t-C(O)R_8$, $-(CH_2)_t-OC(O)R_8$, $-(CH_2)_t-OC(O)OR_8$, or $-(CH_2)_t-C(O)OCH_2OR_8$ in which, $R_8$ is hydrogen, fluorine, $C_{1-12}$ linear, branched, cyclic alkyl group or cyclic alkyl group containing ketone group, and t is an integer of 0 to 6, or $R_6$ and $R_7$ optionally may be attached to each other to form a ring; and l, m and n are integers such that the ratio of l/(l+m+n) is from about 0.1 to about 0.99, the ratio of m/(l+m+n) is from about 0 to about 0.3 and the ratio of n/(l+m+n) is from about 0.01 to about 0.6; and o, p, q, r and s each is independently an integer of from 0 to 2.

Another feature of an embodiment of the present invention relates to a method of preparing a photoresist norbornene-based copolymer, comprising:

addition polymerizing a monomer represented by the following Formula 2 and a monomer represented by the following Formula 3 in the presence of a palladium (II) catalyst in water or in an organic solvent comprising water; and acetalyzing a portion of the acidic functional groups of the monomer represented by the Formula 2.

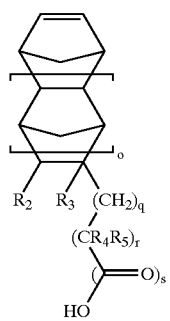

Formula 2

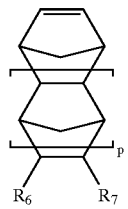

Formula 3 wherein $R_2$, $R_3$, $R_4$ and $R_5$ are independently hydrogen, fluorine, methyl or trifluoromethyl;

$R_6$ and $R_7$ are independently hydrogen or $C_{1-10}$ linear or branched alkyl group, —$(CH_2)_t$—$R_8$, —$(CH_2)_t$—$OR_8$, —$(CH_2)_t$—$C(O)OR_8$, —$(CH_2)_t$—$C(O)R_8$, —$(CH_2)_t$—$OC(O)R_8$, —$(CH_2)_t$—$OC(O)OR_8$, or —$(CH_2)_t$—$C(O)OCH_2OR_8$, in which, $R_8$ is hydrogen, fluorine, $C_{1-12}$ linear, branched, cyclic alkyl group or cyclic alkyl group containing ketone group, and t is an integer of 0 to 6, or $R_6$ and $R_7$ optionally may be bonded with each other to form a ring; and o, p, q, r and s each is independently an integer of 0 to 2.

Another feature of an embodiment of the present invention relates to a method of making a photoresist norbornene-based copolymer, comprising addition polymerizing a monomer represented by the following Formula 2, a monomer represented by the following Formula 3 and an acetal-substituted norbornene-based monomer represented by the Formula 4 in the presence of a palladium (II) catalyst in water or in an organic solvent comprising water.

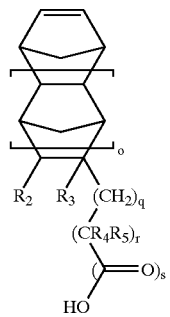

Formula 2

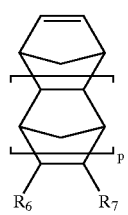

Formula 3

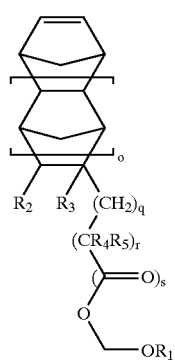

Formula 4 wherein $R_1$ is $C_{1-12}$ linear, branched or cyclic alkyl group; $R_2$, $R_3$, $R_4$ and $R_5$ are independently hydrogen, fluorine, methyl or trifluoromethyl;

$R_6$ and $R_7$ are independently hydrogen atom or $C_{1-10}$ linear, branched alkyl group, —$(CH_2)_t$—$R_8$, —$(CH_2)_t$—$OR_8$, —$(CH_2)_t$—$(O)OR_8$, —$(CH_2)_t$—$(O)$ $R_8$, —$(CH_2)_t$—$OC(O)R_8$, —$(CH_2)_t$—$OC(O)OR_8$, or —$(CH_2)_t$—$C(O)OCH_2OR_8$, in which, $R_8$ is hydrogen atom, fluorine atom, $C_{1-12}$ linear, branched, cyclic alkyl group or cyclic alkyl group containing ketone group, and t is an integer of 0 to 6, or $R_6$ and $R_7$ optionally may be bonded with each other to form a ring; and o, p, q, r and s each is independently an integer of 0 to 2.

An additional feature of an embodiment of the present invention relates to a photoresist composition comprising (a) the norbornene-based copolymer of this invention, (b) a photo acid generator, and (c) an organic solvent.

Other features and advantages of the present invention will become apparent to those skilled in the art from the following detailed description.

DETAILED DESCRIPTION OF THE INVENTION

Figure 1:
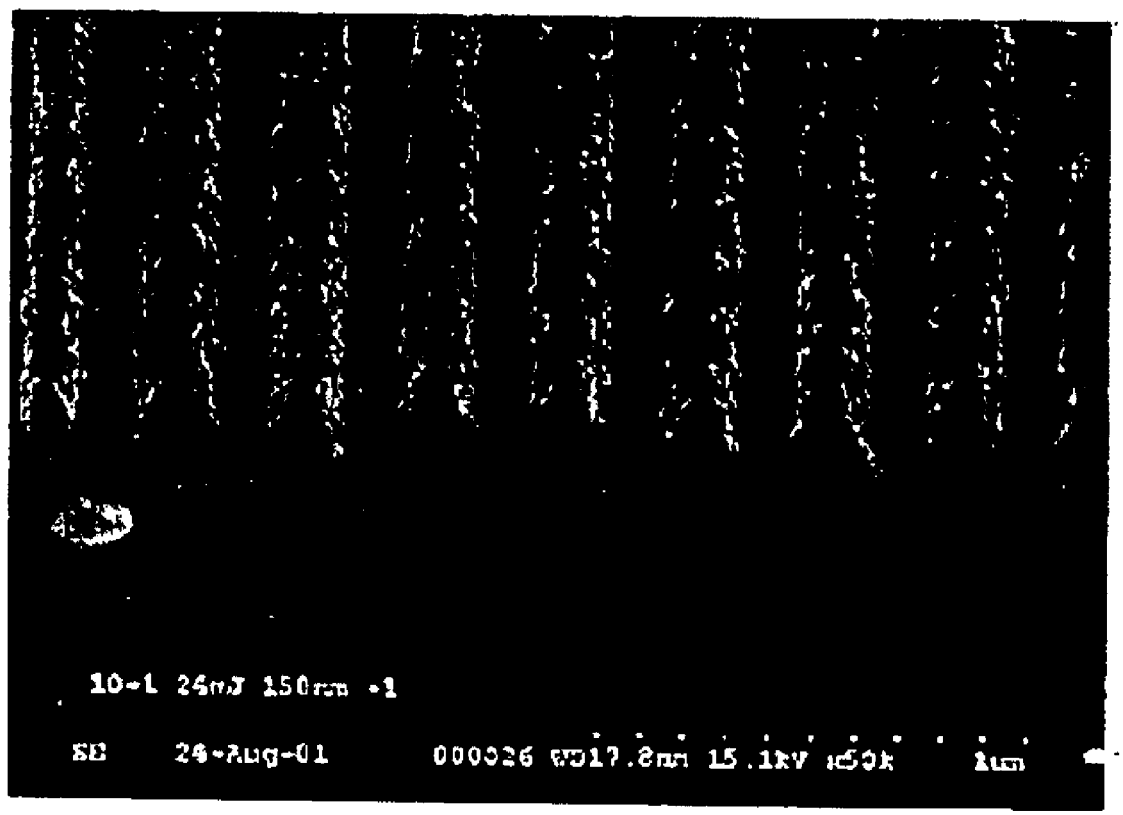
FIG. 1 is a view of photoresist patterns formed using photoresist compositions of the present invention.

Priority Korean Patent Application No. 2001-21602, filed on Apr. 21, 2001 and Priority Korean Patent Application No. 2001-85022, filed on Dec. 26, 2001 are incorporated herein by reference in their entireties.

The present invention relates to an acetal group containing norbornene copolymer useful in a photoresist composition, whereby the copolymer is represented by the following Formula 1, and has at least one alicyclic cyclic unit in its main chain.

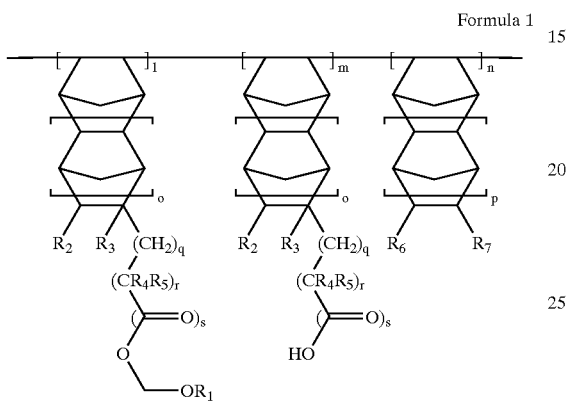

Formula 1 wherein $R_1$ is $C_{1-12}$ linear, branched or cyclic alkyl group; $R_2$, $R_3$, $R_4$ and $R_5$ are independently hydrogen, fluorine, methyl or trifluoromethyl; $R_6$ and $R_7$ are independently hydrogen or $C_{1-10}$ linear, branched alkyl group, $-(CH_2)_t-R_8$, $-(CH_2)_t-OR_8$, $-(CH_2)_t-C(O)OR_8$, $-(CH_2)_t-C(O)R_8$, $-(CH_2)_t-OC(O)R_8$, $-(CH_2)_t-OC(O)OR_8$, or $-(CH_2)_t-C(O)OCH_2OR_8$, in which, $R_8$ is hydrogen, fluorine, $C_{1-12}$ linear, branched, cyclic alkyl group or cyclic alkyl group containing ketone group, and t is an integer of 0 to 6, or $R_6$ and $R_7$ optionally may be bonded with each other to form a ring; and l, m and n are integers such that the ratio of l/(l+m+n) is from 0.1 of 0.99, the ratio of m/(l+m+n) is from 0 to 0.3 and the ratio of n/(l+m+n) is from 0.01 to 0.6; and o, p, q, r and s each is independently an integer of 0 to 2.

Useful norbornene-based monomers for the preparation of the norbornene copolymers of the present invention are norbornene derivatives represented by the following Formula 2, norbornene derivatives represented by the following Formula 3 and acetal-substituted norbornene derivatives represented by the following Formula 4.

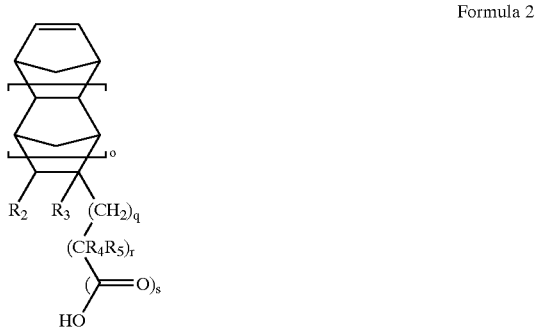

Formula 2

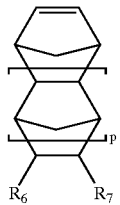

Formula 3

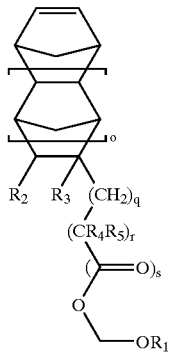

Formula 4 wherein $R_1$ is $C_{1-12}$ linear, branched or cyclic alkyl group; $R_2$, $R_3$, $R_4$ and $R_5$ are independently hydrogen, fluorine, methyl or trifluoromethyl;

$R_6$ and $R_7$ are independently hydrogen or $C_{1-10}$ linear, branched alkyl group, $-(CH_2)_t-R_8$, $-(CH_2)_t-OR_8$, $-(CH_2)_t-(O)OR_8$, $-(CH_2)_t-C(O)R_8$, $-(CH_2)_t-OC(O)R_8$, $-(CH_2)_t-OC(O)OR_8$, or $-(CH_2)_t-C(O)OCH_2OR_8$, in which, $R_8$ is hydrogen, fluorine, $C_{1-12}$ linear, branched, cyclic alkyl group or cyclic alkyl group containing ketone group, and t is an integer of 0 to 6, and $R_6$ and $R_7$ optionally may be bonded with each other to form a ring; and o, p, q, r and s each is independently an integer of 0 to 2.

Non-limiting examples of suitable norbornene derivatives include, for example, norbornene, 2,2-difluoronorbornene, 2-hexyl-5-norbornene, 5-norbornene-2-methanol, 5-norbornene-2-ol, 5-norbornene-2-hexafluoroisopropanol, 5-norbornene-2-methyl-2-carboxylic acid, 5-norbornene-2,3-dimethanol, 5-oxa-tricyclo[5,2,1,0(2,6)]dec-8-en-3-one, and the like. Mixtures and combinations of these derivatives also may be used.

Norbornene derivatives, substituted by acid cleavable protecting group also are suitable for use in the present invention. Examples of suitable norbornene derivatives include $-C(CH_3)_3$, isobornyl, menthyl, 2-methyl-2-adamantanyl, 2-ethyl-2-adamantanyl, tetracyclodecanyl, tetrahydropyranyl, tetrahydropyranoyl, 3-oxocyclohexanoyl, mevalonic lactonyl, dicyclopropylmethyl, methylcyclopropylmethyl, ethylmethylether, and the like. Mixtures and combinations of these derivatives also may be used in the invention.

In the present invention, norbornene monomers and norbornene derivative monomers, which are used in the synthesis of the inventive norbornene copolymer, can be prepared by the Diels-Alder reaction of cyclopentadiene and adequately substituted dienophiles. Reaction Formula 1 shows an exemplary synthetic pathway to these monomers.

Reaction Formula 1

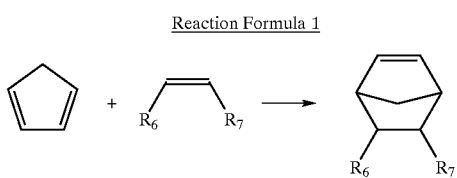

Among the norbornene derivatives represented by the Formula 2, 5-Norbornene-2-carboxylic acid may be synthesized by the Diels-Alder reaction, as shown in the Reaction Formula 2.

Reaction Formula 2

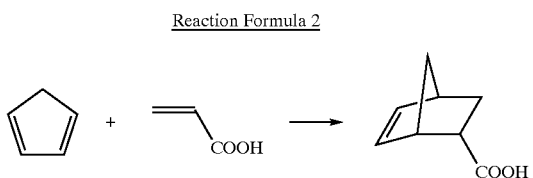

Acetalyzed norbornene monomers, as another monomer useful in preparing the invention copolymers production may be synthesized, for example, by the reaction of the 5-norbornene-2-carboxylic acid with chloromethylethyl-ether in the presence of triethylamine (TEA) (see Reaction Formula 3).

The norbornene copolymers of the present invention may be prepared by any means known in the art for polymerizing multicyclic polymers. For example, the copolymers may be polymerized by radical polymerization, cationic polymerization, addition polymerization, or ring-opening polymerization. It is preferred in the invention to use addition polymerization with a Pd(II)-catalyst, for example, as shown in Formula 5 below.

Formula 5

$$PdX_2, (R'PdX)_2 \text{ or } R''_nPdX_2$$

wherein, X is a halogen or $C_{1-10}$ alkyl group; R' is a $C_{6-12}$ allyl group; R" is a nitrile or a cyclodiene; and n is 1 or 2.

The polymerization preferably is carried out in solution. Examples of suitable solvents include water and any organic solvent. Such solvents can be used either singly or in combination.

While not intending on being bound by any theory of operation, the acetal group containing norbornene copolymer of the invention may be synthesized by at least two types of synthetic pathways, as represented by the following Reaction Formula 4.

Reaction Formula 4

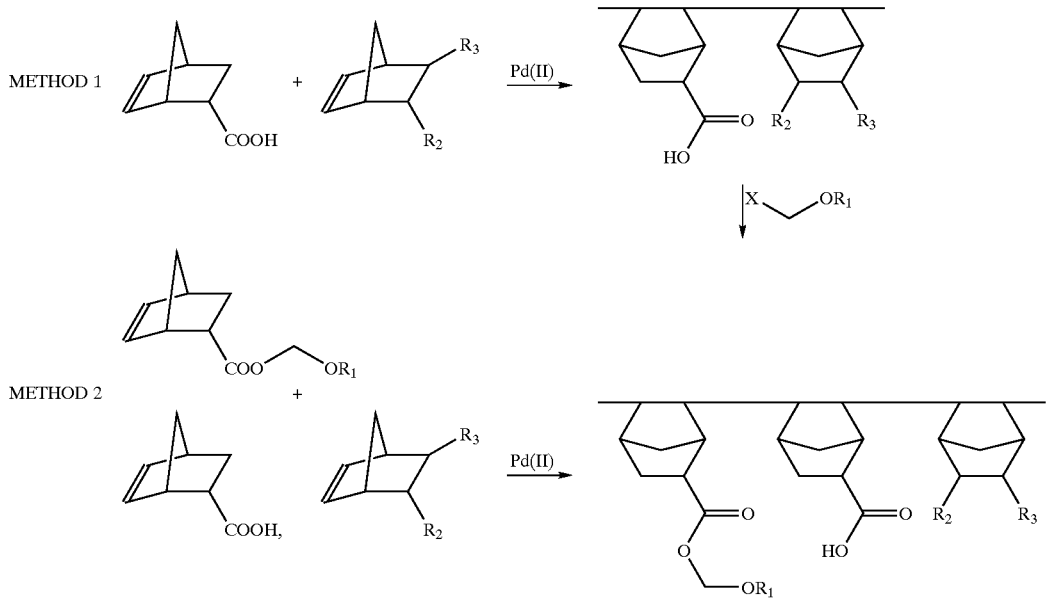

Reaction Formula 3

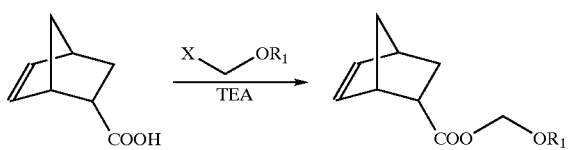

In method 1, a monomer represented by the Formula 2 and a monomer represented by the Formula 3 are copolymerized in the presence of palladium catalyst in solvent, and then, portions of the acidic functional groups of the resulting copolymers are acetalyzed in the same manner as depicted in Reaction Formula 3.

In method 2, a monomer represented by the Formula 2, a monomer represented by the Formula 3 and an acetal-substituted norbornene-based monomer represented by the Formula 4 are added in a reactor at any suitable weight or molar ratio, and then polymerized in the presence of palladium catalyst represented by the Formula 5 in water-based solvent.

The number average molecular weight of the above copolymer synthesized in these manners preferably is within the range of from about 1,000 to about ~200,000 daltons. If the number average molecular weight of the copolymers is less than 1,000 daltons, the copolymer may be too soft to form a thin layer for photoresist. If the number average molecular weight of the copolymers is more than 200,000 daltons, the resulting patterns may be fragile and unstable. Thus, by adjusting the number average molecular weight of norbornene-copolymer in the pre-mentioned range, a stable photoresist thin layer may be formed. It is preferred that the number average molecular weight be within the range of from about 1,000 to about 100,000 daltons, and more preferably from about 1,000 to about 50,000 daltons.

The number average molecular weight can be determined by GPC (Gas Permeation Chromatography) using THF solution. Prior to measurement, GPC is amended by polystyrene standard for measuring the molecular weight between 1,000 and 3,000.000.
ultramicrofilter to provide a photoresist composition that is suitable for use in lithography.

Any organic solvent may be used in the invention so long as it is capable of dissolving the norbornene-based copolymer and photoacid generator. It is preferred that the organic solvent dissolving each component of photoresist composition be at least one compound selected from ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol methyl ether acetate, propylene glycol propyl ether acetate, diethylene glycol dimethyl ether, ethyl lactate, toluene, xylene, methyl ethyl ketone, cyclohexanone, 2-heptanone, 3-heptanone, 4-heptanone, etc. If necessary, an assistant solvent may be used, including N-methylformamide, N,N-dimethylformamide, N-methylacetamide, N,N-dimethylacetamide, N-methylpyrrolidone, dimethylsulfoxide, triphenylimidazole, alcohols, etc. It is preferred to regulate the mixing ratio of the assistant solvent, if used to be 10 weight % or less based on the total weight of the solvent. Those skilled in the art are capable of selecting a suitable solvent and assistant solvent, if needed, using the guidelines provided herein.

The concentration of the copolymers of the present invention in the photoresist composition typically varies based on the particularly chosen organic solvent, photoacid generator and lithographical conditions, etc. Preferred photoresist compositions have anywhere from about 10 to about 30 parts by weight, per 100 parts by weight of the used organic solvent.

Preferred examples of suitable photoacid generators that may be used in the present invention include triphenylsulfonium trifluoromethanesulfonate, triphenylsulfonium perfluorooctanesulfonate, diphenyl-p-tolylsulfonium perfluorooctanesulfonate, tris(p-tolyl)sulfonium perfluoroocatnesulfonate, tris(p-chlorobenzene)sulfonium trifluoromethanesulfonate, tris(p-tolyl)sulfonium trifluoromethanesulfonate, trimethylsulfonium trifluoromethanesulfonate, dimethylphenylsulfonium trifluoromethanesulfonate, dimethyltolylsulfonium trifluoromethanesulfonate, dimethyltolylsulfonium perfluorooctanesulfonate, triphenylsulfonium p-toluenesulfonate, triphenylsulfonium methanesulfonate, triphenylsulfonium butanesulfonate, triphenylsulfonium n-octanesulfonate, triphenylsulfonium 1-naphthalenesulfonate, triphenylsulfonium 2-naphthalenesulfonate, triphenylsulfonium 10-camphorsulfonate, triphenylsulfonium 2,5-dichlorobenzenesulfonate, diphenyltolylsulfonium 1,3,4-trichlorobenzenesulfonate, dimethyl tolylsulfonium p-toluenesufonate, diphenyltolylsulfonium 2,5-dichlorobenzenesulfonate, 1-cyclohexylsulfonyl-1-(1,1-dimethylethylsulfonyl)diazomethane, bis(1,1-dimethylethylsulfonyl)diazomethane, bis(1-methylethylsulfonyl)methane, bis(cyclohexylsulfonyl)diazomethane, 1-cyclohexylsulfonyl-1-cyclohexylcarbonyldiazomethane, 1-diazo-1-cyclohexylsulfonyl-3,3'-dimethylbutane-2-one, 1-diazo-1-methylsulfonyl-4-phenylbutane-2-one, 1-diazo-1-(1,1-dimethylethylsulfonyl)-3,3-dimethyl-2-butanone, 1-acetyl-1-(1-methylethylsulfonyl)diazomethane, etc. Mixtures and combinations of these photoacid generators also may be used in the present invention. The preferred amount of photoacid generator ranges anywhere from about 0.1 to about 10 parts by weight per 100 parts by weight of the above copolymer resin.

The preferred photoresist composition can be applied to a substrate to form a photoresist thin film thereof. Thereafter, photoresist patterns may be formed in the photoresist-coated substrate through post treatments well known in the art. Those skilled in the art will be capable of making the norbornene copolymer, making a photoresist composition including the norbornene copolymers, and making a photoresist pattern, using the guidelines provided herein.

The present invention can be more clearly understood by reference to the following examples. It should be understood that the following examples are not intended to restrict the scope of the present invention in any manner.

PRODUCTION EXAMPLE 1

Synthesis of 5-Norbornene-2-ethoxymethyl Carboxylate (ANCA)

1 mol of 5-norbornene-2-carboxylic acid was dissolved in 1.5 l of THF, and 1.1 mol of triethylamine and 1.1 mol of chloromethylethylether were added thereto. The reaction was carried out at room temperature for 6 hours. After completion of the reaction, the resultant mixture was distilled under reduced pressure to provide 5-norbornene-2-ethoxymethylcarboxylate (ANCA) in 89% yield.

PRODUCTION EXAMPLE 2

Synthesis of 4-Oxa-tricyclo[5,2,1,0(2,6)]dec-8-en-3-one (NL)

1 mol of cyclopentadiene and 1.2 mol of furanone were placed in a reactor and reacted at about 60° C. for about 24 hours. After completion of the reaction, the resultant mixture was distilled under reduced pressure to provide an endo and exo mixture of 4-oxa-tricyclo[5,2,1,0(2,6)]dec-8-en-3-one in 80% yield.

PRODUCTION EXAMPLE 3

Synthesis of 5-Norbornene-2-hexafluoroisopropanol (NFO)

One mol of hexafluoroacetone was added dropwise at 0° C. to 1.1 mol of allylbromide in THF solution. The reaction was carried out at room temperature for 4 hours. After treating with HCl, the reaction mixture was extracted with $H_2O$ and ether, and the organic layer was evaporated under reduced pressure to provide an intermediate product, allyl-hexafluoroisopropanol. Cyclopentadiene (1 mol) and 1 mol of the intermediate product then were placed into a reactor and reacted at about 80° C. for about 24 hours.

After completion of the reaction, the resultant mixture was distilled under reduced pressure to provide an endo and exo mixture of 5-norbornene-2-hexafluoroisopropanol in 60% yield.

PRODUCTION EXAMPLE 4

Synthesis of Copolymer of 5-Norbornene-2-carboxylic Acid (NCA) and 5-Norbornene-2-methanol (NM)

Poly[NCA/NM]=9/1(w/w)

Palladium chloride (1.0 g) and 30 g of a $H_2O$-THF mixture solution were added to a reactor, and as comonomers, 54 g of 5-norbornene-2-carboxylic acid and 6 g of 5-norbornene-2-methanol were added thereto, followed by reaction at about 40° C. for 24 hours under $N_2$ atmosphere. After the completion of the reaction, the polymerized reaction mixture was diluted with an adequate amount of THF solvent, subsequently precipitated in a $H_2O$-ethanol mixture of 1:1 ratio, filtered and dried to provide a target polymer having a number average molecular weight of 2,500 daltons in 89% yield.

2) Poly[NCA/NM]=7/3(w/w)

Polymerization was conducted in a manner similar to that in 1) above except for the use of 42 g of 5-norbornene-2-carboxylic acid and 18 g of 5-norbornene-2-methanol in place of 54 g of 5-norbornene-2-carboxylic acid and 6 g of 5-norbornene-2-methanol. The target product was obtained (yield: 80%, $M_n$: 2,600 daltons).

3) Poly[NCA/NM]=5/5(w/w)

Polymerization was conducted in a manner similar to that in 1) above except for the use of 30 g of 5-norbornene-2-carboxylic acid and 30 g of 5-norbornene-2-methanol in place of 54 g of 5-norbornene-2-carboxylic acid and 6 g of 5-norbornene-2-methanol. The target product was obtained (yield: 64%, $M_n$: 2,500 daltons).

PRODUCTION EXAMPLE 5

Synthesis of Copolymer of 5-Norbornene-2-carboxylic Acid (NCA) and 4-Oxa-tricyclo [5,2,1,0(2,6)]dec-8-en-3-one (NL), Poly[NCA/NL]=7/3(w/w)

Polymerization was carried out in a manner similar to that in Production Example 4 except for the use of 42 g of 5-norbornene-2-carboxylic acid and 18 g of 4-oxa-tricyclo [5,2,1,0(2,6)]dec-8-en-3-one as comonomers. The target product was obtained (yield: 60%, $M_n$: 2,700 daltons).

PRODUCTION EXAMPLE 6

Synthesis of Copolymer of 5-Norbornene-2-carboxylic Acid (NCA) and Norbornene (NB), Poly[NCA/NB]=7/3(w/w)

Polymerization was carried out in a manner similar to that in Production Example 4, except for the use of 42 g of 5-norbornene-2-carboxylic acid and 18 g of norbornene as comonomers. The target product was obtained (yield: 52%, $M_n$: 2,200 daltons).

PRODUCTION EXAMPLE 7

Synthesis of Copolymer of 5-Norbornene-2-carboxylic Acid (NCA) and 5-Norbornene-2,3-dimethanol (NDM), Poly[NCA/NDM]=7/3(w/w)

Polymerization was carried out in a manner similar to that in Production Example 4 except for the use of 42 g of 5-norbornene-2-carboxylic acid and 18 g of 5-norbornene-2,3-dimethanol as comonomers. The target product was obtained (yield: 62%, $M_n$: 2,800 daltons).

PRODUCTION EXAMPLE 8

Synthesis of Copolymer of 5-Norbornene-2-carboxylic Acid (NCA) and 5-Norbornene-2-ol (NO), Poly[NCA/NO]=7/3(w/w)

Polymerization was carried out in a manner similar to that in Production Example 4 except for the use of 42 g of 5-norbornene-2-carboxylic acid and 18 g of 5-norbornene-2-ol as comonomers. The target product was obtained (yield: 75%, $M_n$: 2,300 daltons).

PRODUCTION EXAMPLE 9

Synthesis of Copolymer of 5-Norbornene-2-hexafluoroisopropanol (NFO) and 5-Norbornene-2-ol(NO), Poly[NFO/NO]=7/3(w/w)

Polymerization was carried out in a manner similar to that in Production Example 4 except for the use of 42 g of 5-norbornene-2-hexafluoroisopropanol and 18 g of 5-norbornene-2-ol as comonomers. The target product was obtained (yield: 68%, $M_n$: 2,700 daltons).

PRODUCTION EXAMPLE 10

Synthesis of Copolymer of 5-Norbornene-2-carboxylic Acid (NCA) and 5-Norbornene-2-carboxylic Acid T-butylate (NtB), Poly[NCA/NtB]=7/3(w/w)

Polymerization was carried out in a manner similar to that in Production Example 4 except for the use of 42 g of 5-norbornene-2-carboxylic acid and 18 g of 5-norbornene-2-carboxylic acid t-butylate as comonomers. The target product was obtained (yield: 61%, $M_n$: 2,600 daltons).

The product was confirmed by $^1$H-NMR and FTIR. $^1$H-NMR (DMSO-d6) δ: 1.4 (—C(CH$_3$)$_3$ [t-butyl]), 2~3.0 (—CH$_2$, —CH [bridgehead, main chain]), 11.7 (—OH [carboxylic acid]), FTIR (film on NaCl) cm$^{-1}$: 3200–3400 (OH), 2900–3000 (C—H), 1720 (C=O, ester), 1700 (C=O, carboxylic acid), 1150 (C—O—C, ester).

The metal components were removed from the produced copolymer in accordance with the following procedure. Each norbornene copolymer produced in the above production examples 4 to 9 was dissolved in THF in an amount of 10 weight %, and the solution was stirred with bubbling $H_2$ gas through the solution for about 5 hours. The resulting dark precipitate was filtered off, and the filtrate was precipitated in distilled water, filtered, and then dried.

PRODUCTION EXAMPLE 11

Synthesis of Poly[ANCA/NCA/NM]=4/3/3(w/w/w)

Method 1

Poly[NCA/NM]=7/3(w/w), (30 g), prepared in Production Example 4, was dissolved in 360 ml of THF, followed by addition of 8.8 g of triethylamine and 10.6 g of chloromethylethylether. The mixture then was reacted under an $N_2$ atmosphere for about 3 to 5 hours. After completion of the reaction, the polymerized reaction mixture was precipitated in $H_2O$, filtered and dried to provide the target polymer having a number average molecular weight of 2,800 in 96% yield.

2) Method 2

Palladium chloride (0.5 g) was dissolved in 15 g of a $H_2O$-THF mixture, followed by addition of the 12 g of 5-Norbornene-2-ethoxymethylcarboxylate (ANCA) prepared in Production Example 4, 9 g of 5-Norbornene-2-carboxylate and 9 g of 5-Norbornene-2-methanol. The reaction then was carried out at about 40° C. for 24 hours under a $N_2$ atmosphere. After completion of the reaction, the polymerized reaction mixture was diluted with an adequate amount of THF solvent, was subsequently precipitated in a $H_2O$-ethanol mixture having a 1:1 ratio, filtered and dried to provide the target polymer having a number average molecular weight of 2,100 at 51% yield.

PRODUCTION EXAMPLE 12

Synthesis of Poly[ANCA/NCA/NL]=4/313(w/w/w)

Production Example 11-1) was repeated, except that Poly [NCA/NL]=7/3(w/w), prepared in Production Example 5 was used. The target product was obtained (yield: 94%, $M_n$: 2,900 daltons).

PRODUCTION EXAMPLE 13

Synthesis of Poly[ANCA/NCA/NB]=4/3/3(w/w/w)

Production Example 11-1) was repeated, except that Poly [NCA/NB]7/3(w/w), prepared in Production Example 6 was used. The target product was obtained (yield: 95%, $M_n$: 2,300 daltons).

PRODUCTION EXAMPLE 14

Synthesis of Poly[ANCA/NCA/NDM]=4/3/3(w/w/w)

Production Example 11-1) was repeated, except that Poly [NCA/NDM]=7/3(w/w), prepared in Production Example 7 was used. The target product was obtained (yield: 90%, $M_n$: 2,900 daltons).

PRODUCTION EXAMPLE 15

Synthesis of Poly[ANCA/NCA/NO]=4/3/3(w/w/w)

Production Example 11-1) was repeated, except that Poly [NCA/NO]=7/3(w/w), prepared in Production Example 8 was used. The target product was obtained (yield: 93%, $M_n$: 2,500 daltons).

PRODUCTION EXAMPLE 16

Synthesis of Poly[ANFO/NCA/NO]=4/3/3(w/w/w)

Production Example 11-1) was repeated, except that Poly [NFO/NO]=7/3(w/w), prepared in Production Example 9 was used. The target product was obtained (yield: 90%, $M_n$: 2,900 daltons).

PRODUCTION EXAMPLE 17

Synthesis of Poly[ANCA/NCA/NtB]=41313(w/w/w)

Production Example 11-1) was repeated, except that Poly [NCA/NtB]=7/3(w/w), prepared in Production Example 10 was used. The target product was obtained (yield: 92%, $M_n$: 3,000 daltons).

The product was confirmed by $^1$H-NMR and FTIR. $^1$H-NMR (DMSO-d6) δ: 1.1, 3.6 (—CH$_2$CH$_3$[ethyl]), 1.4 (—C(CH$_3$)$_3$ [t-butyl]), 2~3.0 (—CH$_2$, —CH [bridgehead, main chain]), 5.2 (O—CH$_2$—O [methyl]), 11.7 (—OH [carboxylic acid]). FTIR (film on NaCl) cm$^{-1}$: 3200–3400 (OH), 2900–3000 (C—H), 1720 (C═O, ester), 1700 (C═O, carboxylic acid), 1150 (C—O—C, ester), 1115 (C—O—C, ether).

Production of the Photoresist Composition and Formation of Patterns

Each copolymer obtained in the above production examples 11–17 was dissolved at a concentration of 12 weight % in cyclohexane. Triphenylsulfonium trifluoromethanesulfonate, a known photoacid generator, then was added thereto in an amount of 3 parts by weight, based on 100 parts of the copolymer. The mixture was dissolved, and then filtered using a filter having pores of 0.2 μm to provide a resist solution.

The resist solution obtained in this manner was spin-coated onto a silicon wafer to a thickness of approximately 0.5 μm, and then prebaked at approximately 110° C. After baking, the wafer was exposed to an ArF excimer laser, and then was subjected to postbaking at 110° C. Finally, the photoresist was developed using 2.38 weight % of tetramethyl ammonium hydroxide for 60 seconds to form a photoresist pattern. FIG. 1 is a photograph of the positive patterns having a thickness of 0.15 μm, which was formed by use of the copolymer prepared in the Production Example 17.

As described in the above examples, an acetal group containing norbornene copolymer prepared through the novel production method of the present invention may be developed by an alkaline developer. The copolymer composition has excellent adhesion to the substrate as well as excellent transparency at a wavelength of not more than 200 nm, excellent resolution, and excellent sensitivity and dry etching resistance. As a result, the copolymer of the present invention is useful in lithography of very large scale integrated semiconductors with electron beam or deep UV, as well as with excimer laser.

Although the preferred embodiments of the present invention have been disclosed for illustrative purposes, those skilled in the art will appreciate that various modifications, additions, and substitutions are possible, without departing from the scope and spirit of the present invention.

What is claimed is:

1. An acetal group containing norbornene copolymer consisting of the following Formula 1

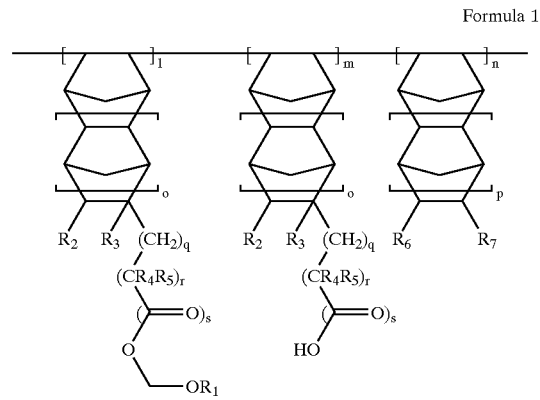

Formula 1 wherein $R_1$ is a $C_{1-12}$ linear, branched or cyclic alkyl group; $R_2$, $R_3$, $R_4$ and $R_5$ are independently hydrogen, fluorine, methyl or trifluoromethyl;

$R_6$ and $R_7$ are independently hydrogen or $C_{1-10}$ linear or branched alkyl group, —(CH$_2$)$_t$—R$_8$, —(CH$_2$)$_t$—OR$_8$, —(CH$_2$)$_t$—C(O)OR$_8$, —(CH$_2$)$_t$—C(O)R$_8$, —(CH$_2$)$_t$—OC(O)R$_8$, —(CH$_2$)$_t$—OC(O)OR$_8$, or —(CH$_2$)$_t$—C(O)OCH$_2$OR$_8$ in which, $R_8$ is hydrogen, fluorine, $C_{1-12}$ linear, branched, cyclic alkyl group or cyclic alkyl group containing ketone group, and t is an integer of 0 to 6, or $R_6$ and $R_7$ are optionally attached to each other to form a ring;

l, m and n are integers whereby the ratio of l/(l+m+n) is from about 0.1 to about 0.99, the ratio of m/(l+m+n) is from about 0 to about 0.3 and the ratio of n/(l+m+n) is from about 0.01 to about 0.6; and o, p, q, r and s each is independently an integer from 0 to 2.

2. A method of making a norbornene-based copolymer, comprising:

copolymerizing a monomer represented by the following Formula 2 and a monomer represented by the following Formula 3 in the presence of a palladium (II) catalyst in water or in organic solvents comprising water; and acetalyzing at least a portion of the acidic functional groups of the monomer represented by the Formula 2

Formula 2

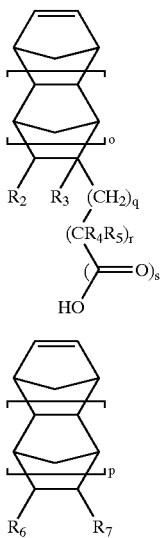

wherein $R_2$, $R_3$, $R_4$ and $R_5$ are independently hydrogen, fluorine, methyl or trifluoromethyl;

$R_6$ and $R_7$ are independently hydrogen or $C_{1-10}$ linear or branched alkyl group, $-(CH_2)_t-R_8$, $-(CH_2)_t-OR_8$, $-(CH_2)_t-C(O)OR_8$, $-(CH_2)_t-C(O)R_8$, $-(CH_2)_t-OC(O)R_8$, $-(CH_2)_t-OC(O)OR_8$, or $-(CH_2)_t-C(O)OCH_2OR_8$, in which, $R_8$ is hydrogen, fluorine, $C_{1-12}$ linear, branched, cyclic alkyl group or cyclic alkyl group containing ketone group, and t is an integer of 0 to 6, or $R_6$ and $R_7$ optionally are bonded to each other to form a ring, and o, p, q, r and s each is independently an integer of 0 to 2.

3. A method of making a norbornene-based copolymer, comprising copolymerizing a monomer represented by the following Formula 2, a monomer represented by the following Formula 3 and a acetal-substituted norborne-based monomer represented by the Formula 4 in the presence of a palladium (II) catalyst in water or in organic solvents comprising water Formula 2

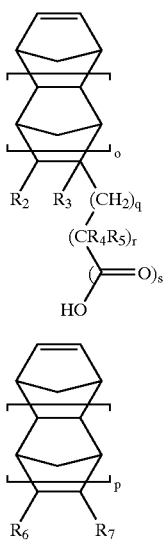

Formula 3

Formula 4

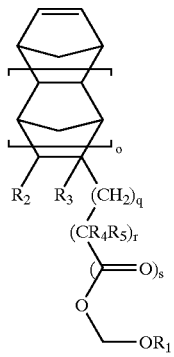

wherein $R_1$ is $C_{1-12}$ linear, branched or cyclic alkyl group; $R_1$, $R_3$, $R_4$ and $R_5$ are independently hydrogen, fluorine, methyl or trifluoromethyl; $R_6$ and $R_7$ are independently hydrogen atom or $C_{1-10}$ linear, branched alkyl group, $-(CH_2)_t-R_8$, $-(CH_2)_t-OR_8$, $-(CH_2)_t-C(O)OR_8$, $-(CH_2)_t-C(O)R_8$, $-(CH_2)_t-OC(O)R_8$, $-(CH_2)_t-OC(O)OR_8$, or $-(CH_2)_t-C(O)OCH_2OR_8$ in which, $R_8$ is hydrogen atom, fluorine atom, $C_{1-12}$ linear, branched, cyclic alkyl group or cyclic alkyl group containing ketone group, and t is an integer of 0 to 6, or $R_6$ and $R_7$ optionally are bonded to each other to form a ring; and o, p, q, r and s each is independently an integer of 0 to 2.

4. A method as claimed in claim 2, wherein the palladium (II) catalyst is represented by the following Formula 5

Formula 5

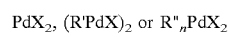

wherein,

X is a halogen atom or $C_{1-10}$ alkyl group;

R' is a $C_{6-12}$ allyl group;

R" is a nitrile or a cyclodiene; and n is 1 or 2.

5. The method as claimed in claim 3, wherein the palladium (II) catalyst is represented by the following Formula 5

Formula 5

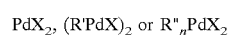

wherein,

X is a halogen atom or $C_{1-10}$ alkyl group;

R' is a $C_{6-12}$ alkyl group;

R" is a nitrile or a cyclodiene; and n is 1 or 2.

6. A photoresist composition comprising (a) the norbornene copolymer according to the claim 1, (b) a photo acid generator and (c) an organic solvent.

* * * * *